(12) United States Patent
Choi et al.

(10) Patent No.: US 7,352,646 B2
(45) Date of Patent: Apr. 1, 2008

(54) SEMICONDUCTOR MEMORY DEVICE AND METHOD OF ARRANGING A DECOUPLING CAPACITOR THEREOF

(75) Inventors: Hyung-Chan Choi, Gyeonggi-do (KR); Chi-Wook Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/024,348

(22) Filed: Dec. 27, 2004

(65) Prior Publication Data

US 2005/0152203 A1    Jul. 14, 2005

(30) Foreign Application Priority Data

Jan. 8, 2004    (KR)    ............ 10-2004-0001279

(51) Int. Cl.
*G11C 8/00*    (2006.01)

(52) U.S. Cl. ............ 365/230.03; 365/185.21; 365/196; 365/207

(58) Field of Classification Search ......... 365/230.03, 365/196, 207
See application file for complete search history.

(56) References Cited

U.S. PATENT DOCUMENTS

| | | | | |
|---|---|---|---|---|
| 5,311,478 A | * | 5/1994 | Zagar et al. | ............ 365/230.06 |
| 5,594,704 A | * | 1/1997 | Konishi et al. | ............ 365/233 |
| 6,222,223 B1 | * | 4/2001 | Tobita | ............ 257/311 |
| 6,337,824 B1 | * | 1/2002 | Kono et al. | ............ 365/207 |
| 6,392,942 B2 | * | 5/2002 | Noda et al. | ............ 365/205 |
| 6,392,944 B1 | * | 5/2002 | Kono | ............ 365/208 |
| 6,674,676 B1 | * | 1/2004 | Hsu et al. | ............ 365/200 |

FOREIGN PATENT DOCUMENTS

KR    2003-0001242    1/2003

OTHER PUBLICATIONS

English language abstract of Korean Publication No. 2003-0001242.

\* cited by examiner

*Primary Examiner*—Amir Zarabian
*Assistant Examiner*—Anthan T Tran
(74) *Attorney, Agent, or Firm*—Marger Johnson & McCollom, P.C.

(57) ABSTRACT

A semiconductor memory device with improved operational performance by reducing the level variation of first and second power voltages applied to a sense amplifier by efficiently locating a decoupling capacitor. The decoupling capacitor is arranged on an empty region of a plurality of the first and second sense amplifiers and connected between the first and second power voltage lines. A plurality of global data I/O line pairs is arranged perpendicular to the direction of a plurality of local data I/O line pairs.

18 Claims, 5 Drawing Sheets

SEMICONDUCTOR MEMORY DEVICE AND METHOD OF ARRANGING A DECOUPLING CAPACITOR THEREOF

CROSS-REFERENCE TO RELATED APPLICATION

This application claims the benefit of Korean Patent Application No. 2004-1279, filed on Jan. 8, 2004, the disclosure of which is hereby incorporated herein by reference in its entirety.

BACKGROUND OF THE INVENTION

1. Field of the Invention

The present invention relates to a semiconductor memory device and, more particularly, to a semiconductor memory device which has local and global data line pairs and a method of arranging a decoupling capacitor thereof.

2. Description of the Related Art

A decoupling capacitor of a semiconductor memory device is an elementary component used to filter noise which exists between power lines such as a first power voltage line and a second power voltage line.

In general, a decoupling capacitor of a conventional semiconductor memory device is arranged not on a memory cell array region but on an empty space of a peripheral circuit region. Therefore, a region on which a decoupling capacitor is arranged is limited, and in order to have effective noise filtering, a decoupling capacitor having a high capacitance should be arranged on the limited region.

Also, a decoupling capacitor of a conventional semiconductor memory device has a plurality of MOS capacitors, which are connected in parallel, between first and second power voltage lines.

Figure 1:
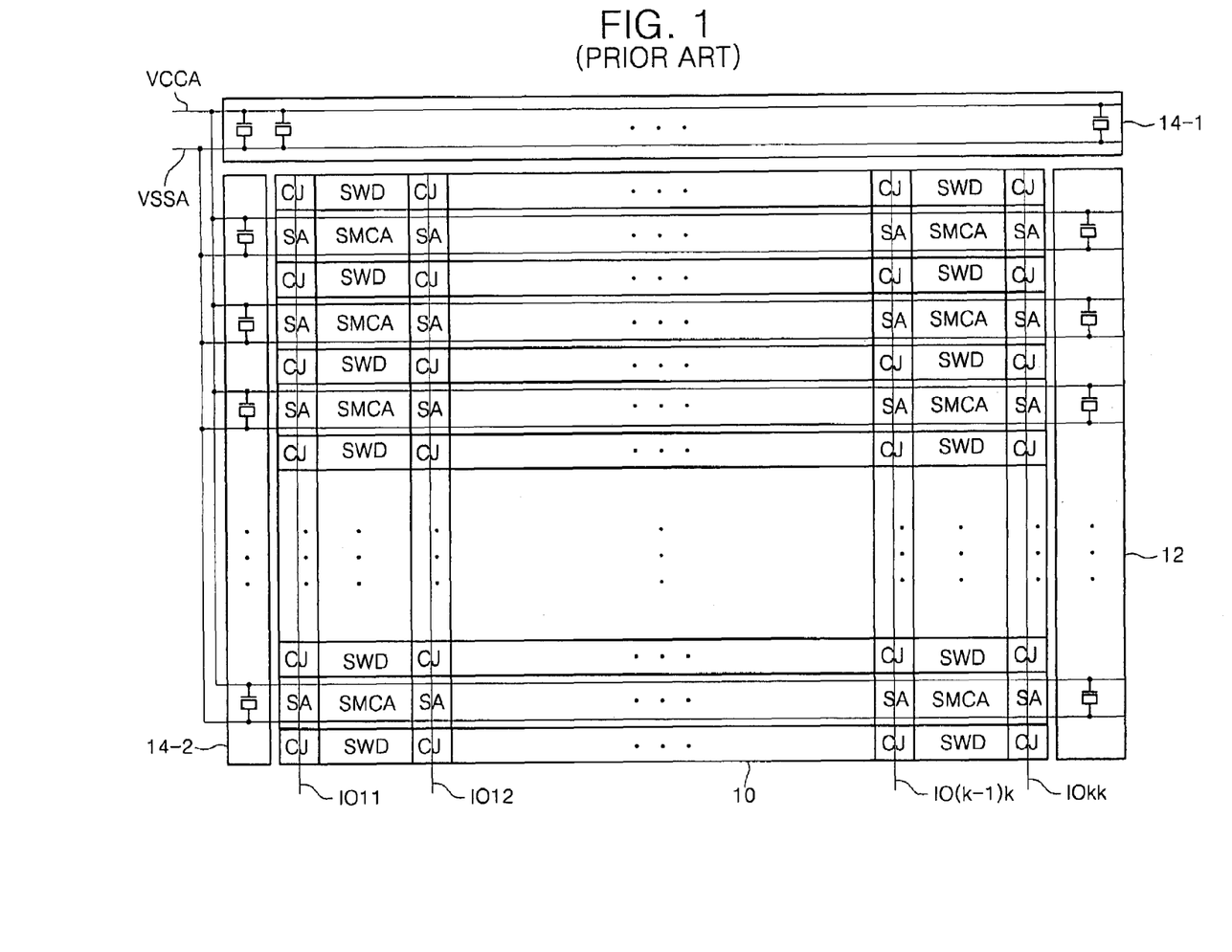
FIG. 1 is a schematic view illustrating an arrangement of a conventional semiconductor memory device.

FIG. 1 is a schematic view illustrating an arrangement of a conventional semiconductor memory device. The semiconductor memory device of FIG. 1 includes a memory cell array 10, a column decoder 12, and decoupling capacitor blocks 14-1 and 14-2.

As shown in FIG. 1, the memory cell array 10 includes a plurality of sub memory cell array blocks SMCA that are arranged in vertical or transverse directions, sense amplifiers SA that are arranged on both left and right sides of a plurality of sub memory cell array blocks SMCA, and sub word line drivers SWD that are arranged above and below a plurality of sub memory cell array blocks SMCA. Conjunction regions CJ are arranged between the sub word line drivers SWD. A control signal generating circuit for controlling the sub word line driver SWD and a control signal generating circuit for controlling the sense amplifier SA are arranged on the conjunction region CJ. Data I/O lines 10 are arranged in a vertical direction, and first and second power voltage lines VCCA and VSSA, respectively, are alternately arranged in a transverse direction. Data I/O line pairs IO11, IO12 to IO(k−1)k,IOkk are arranged in a transverse direction above regions on which the sense amplifiers SA and the conjunction regions CJ are arranged.

A decoupling capacitor of the conventional semiconductor memory device described above is arranged on an empty region of the column decoder 12 and between the first power voltage line VCCA and the second power voltage line VSSA of the decoupling capacitor blocks 14-1 and 14-2. The first power voltage line VCCA is greater in level than the second power voltage line VSSA, and the decoupling capacitor includes MOS capacitors.

Figure 2:
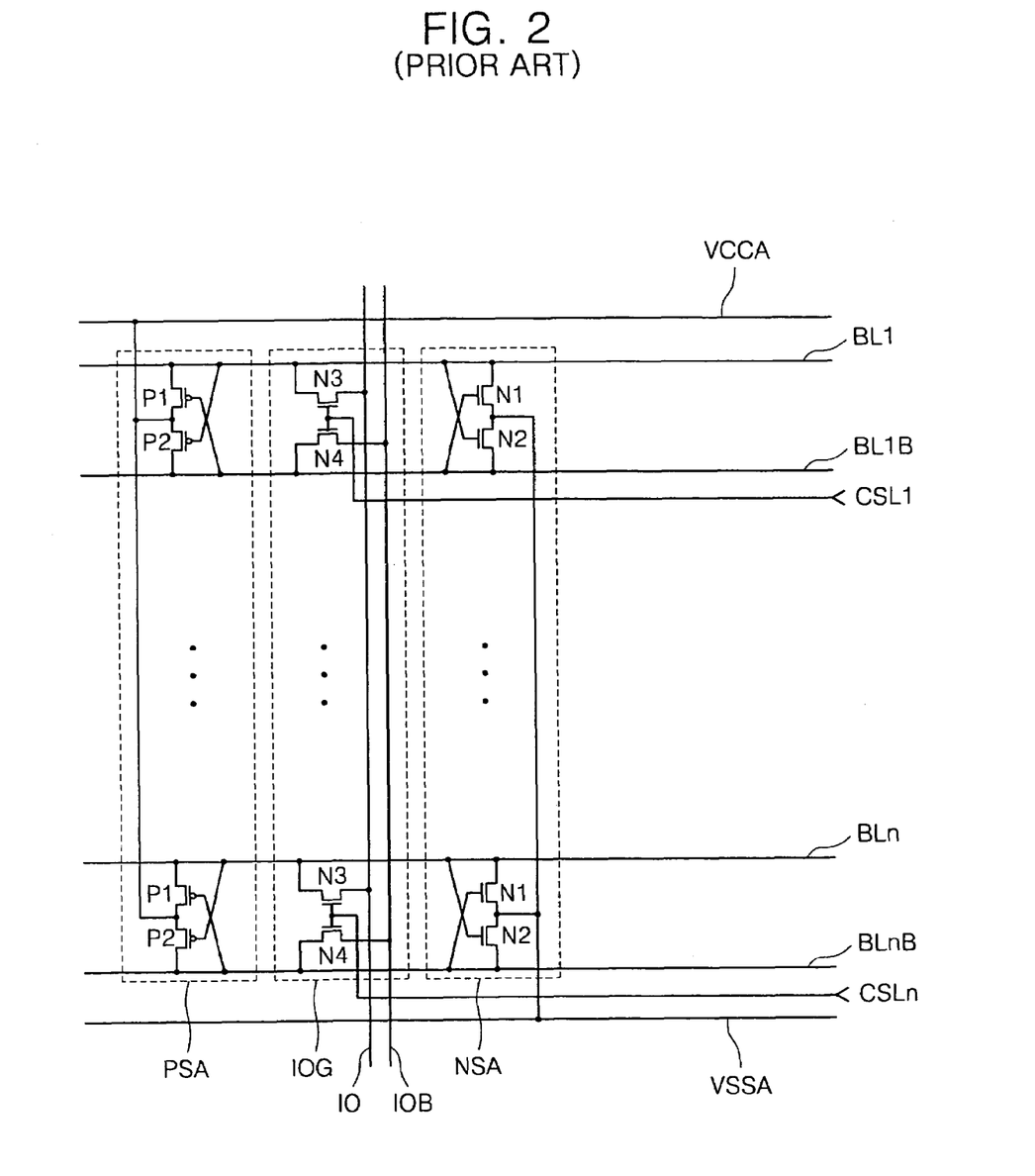
FIG. 2 is a schematic view illustrating a sense amplifier of the conventional semiconductor memory device of FIG. 1.

FIG. 2 is a schematic view illustrating the sense amplifier SA of the conventional semiconductor memory device of FIG. 1. The sense amplifier SA includes a PMOS sense amplifier PSA, a data I/O gate IOG, and an NMOS sense amplifier NSA.

The PMOS sense amplifier PSA includes PMOS transistors P1 and P2, which are connected between each of a plurality of bit line pairs BL1,BL1B to BLn,BLnB. The NMOS sense amplifier NSA includes NMOS transistors N1 and N2, which are connected between each of a plurality of bit line pairs BL1,BL1B to BLn,BLnB. The data I/O gate IOG includes NMOS transistors N3 and N4, which are connected between each of a plurality of bit line pairs BL1,BL1B to BLn,BLnB and between the data I/O line pair IO and IOB.

Operation of the sense amplifier SA is explained below.

The PMOS sense amplifier PSA is connected to the first power voltage line VCCA and amplifies data of a "low" level of a plurality of bit line pairs BL1,BL1B to BLn,BLnB to a first power voltage level when a first power voltage is supplied thereto. The NMOS sense amplifier NSA is connected to the second power voltage line VSSA and amplifies data of a "high" level of a plurality of bit line pairs BL1,BL1B to BLn,BLnB to a second power voltage level when a second power voltage is supplied thereto. The data I/O gate IOG is turned on in response to each of column selecting signals CSL1 to CSLn to transmit data between one of a plurality of bit line pairs BL1,BL1B to BLn,BLnB and the data I/O line pair IO,IOB.

The sense amplifiers of the semiconductor memory device of FIG. 1 have the same configuration as the sense amplifier of FIG. 2. Therefore, as shown in FIG. 2, there is no empty space which provides a region on which the decoupling capacitor could be arranged. That is, the decoupling capacitor cannot be arranged in the memory cell array of the conventional semiconductor memory device.

In the conventional semiconductor memory device, the sense amplifiers connected to a plurality of bit lines simultaneously operate at a point in time where the bit line is sensed, thereby generating noise. As a result, the level of the first power voltage falls transiently, and the level of the second power voltage rises transiently. The decoupling capacitor can mitigate a level variation of the first and second power voltages.

However, since the decoupling capacitors, which can mitigate a level variation of the first and second power voltages, are arranged only on a peripheral region of the memory cell array, the sense amplifiers arranged on a central portion of the memory cell array are delayed in amplifying the first and second power voltages, thereby deteriorating the operational performance of the semiconductor memory device.

SUMMARY OF THE INVENTION

It is an object of the present invention to provide a semiconductor memory device with an improved operational performance by reducing the level variation of first and second power voltages applied to a sense amplifier that is far from a decoupling capacitor.

It is another object of the present invention to provide a method of arranging a decoupling capacitor of a semiconductor memory device that can improve the operational performance by reducing the level variation of first and second power voltages applied to a sense amplifier that is far from the decoupling capacitor.

In order to achieve the above objects, the present invention provides a semiconductor memory device, comprising: a plurality of sub memory cell array blocks including a plurality of memory cells connected between a plurality of word lines and a plurality of bit lines; a plurality of local data I/O line pairs separately arranged between each of the plurality of the sub memory cell array blocks; a plurality of global data I/O line pairs arranged in a perpendicular direction to the plurality of the local data I/O line pairs; a plurality of first sense amplifiers arranged on left and right sides of each of first sub memory cell array blocks among the plurality of the sub memory cell array blocks; and a plurality of second sense amplifiers arranged on left and right sides of each of second sub memory cell array blocks among the plurality of the sub memory cell array blocks, wherein a decoupling capacitor is arranged on an empty region of the plurality of the first and second sense amplifiers and connected between the first and second power voltage lines.

The decoupling capacitor includes a MOS capacitor or a memory cell capacitor identical to a capacitor for forming the memory cell.

Each of the plurality of the first sense amplifiers include a PMOS sense amplifier for amplifying data of the bit line pair; an NMOS sense amplifier for amplifying data of the bit line pair; a local sense amplifier arranged between the PMOS sense amplifier and the NMOS sense amplifier, for amplifying data of the local data line pair to be transmitted to the global data line pair, the number of local sense amplifiers being equal to the number of the local data line pairs; and the decoupling capacitor arranged between the PMOS sense amplifier and the NMOS sense amplifier and arranged on an empty region on which the local sense amplifier is not arranged.

Each of the plurality of the second sense amplifiers include a PMOS sense amplifier for amplifying data of the bit line pair; an NMOS sense amplifier for amplifying data of the bit line pair; and the decoupling capacitor arranged between the PMOS sense amplifier and the NMOS sense amplifier.

The present invention further provides a method of arranging a decoupling capacitor of a semiconductor memory device, the semiconductor memory device including a plurality of sub memory cell array blocks including a plurality of memory cells connected between a plurality of word lines and a plurality of bit line pairs, a plurality of local data I/O line pairs separately arranged between each of the plurality of the sub memory cell array blocks, and a plurality of global data I/O line pairs arranged in a perpendicular direction to the plurality of the local data I/O line pairs, the method comprising: arranging a plurality of first sense amplifiers on left and right sides of each of first sub memory cell array blocks among the plurality of the sub memory cell array blocks; arranging a plurality of second sense amplifiers on left and right sides of each of second sub memory cell array blocks among the plurality of the sub memory cell array blocks; and arranging a decoupling capacitor on an empty region of the plurality of the first and second sense amplifiers and connecting the decoupling capacitor between the first and second power voltage lines.

The step of arranging the first sense amplifier includes arranging PMOS and NMOS sense amplifiers between the plurality of the bit line pairs, respectively; and arranging a local sense amplifier between regions on which the plurality of the PMOS and NMOS sense amplifiers is not arranged, and arranging the decoupling capacitor on an empty region on which the local sense amplifier is not arranged.

The step of arranging the second sense amplifier includes arranging PMOS and NMOS sense amplifiers between the plurality of the bit line pairs, respectively; and arranging a decoupling capacitor between regions on which the plurality of the PMOS and NMOS sense amplifiers is not arranged.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 3:
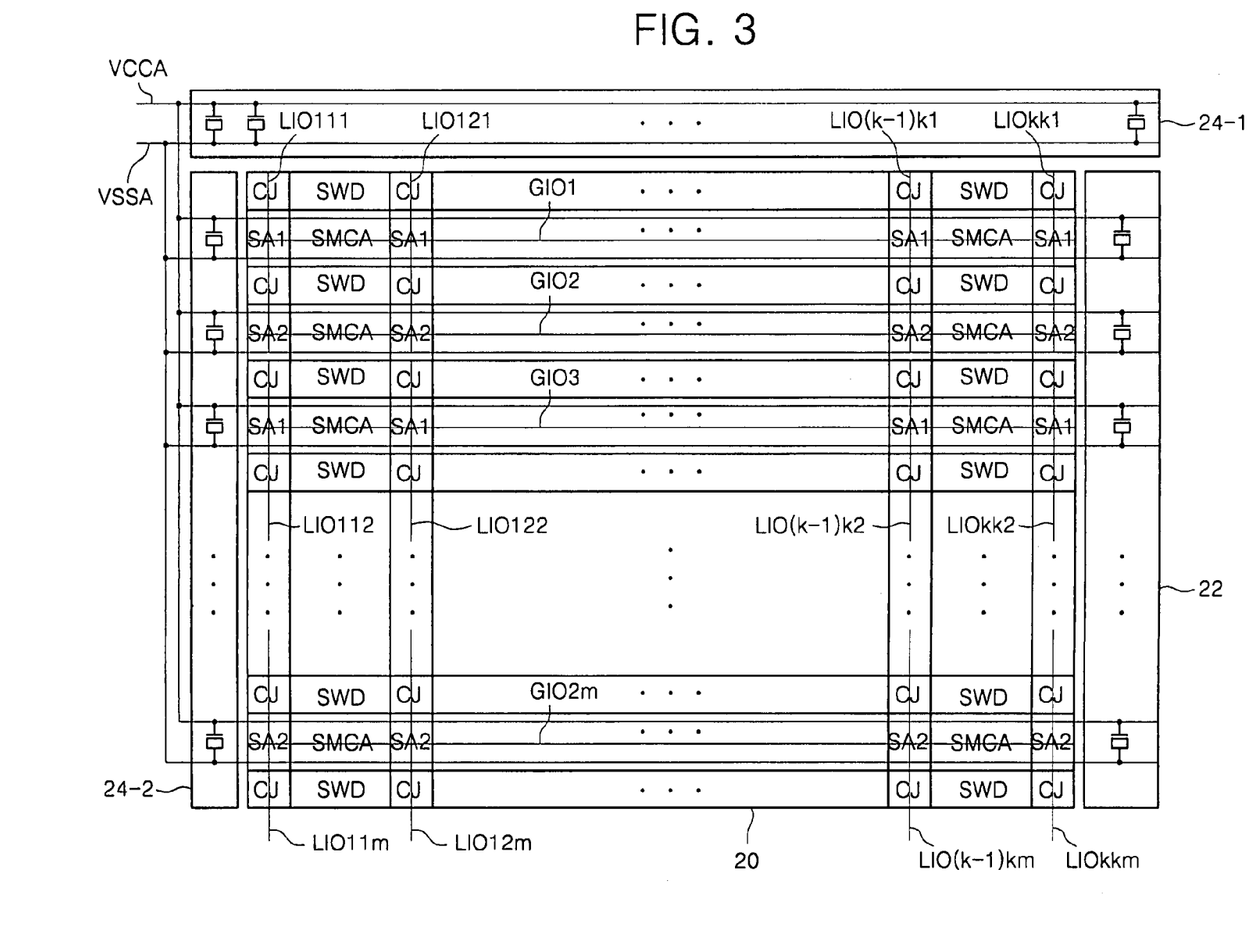
FIG. 3 is a block diagram illustrating a semiconductor memory device according to an embodiment of the present invention.

FIG. 3 is a block diagram illustrating a semiconductor memory device according to an embodiment of the present invention. The semiconductor memory device of FIG. 3 includes a memory cell array 20, a column decoder 22, and decoupling capacitor blocks 24-1 and 24-2.

As shown in FIG. 3, the memory cell array 20 includes a plurality of sub memory cell array blocks SMCA, which are arranged in vertical or transverse directions, sense amplifiers SA1 and SA2, which are alternately arranged on both left and right sides of the plurality of sub memory cell array blocks SMCA, and sub word line drivers SWD which are arranged above and below a plurality of sub memory cell array blocks SMCA. Conjunction regions CJ are arranged between the sub word line drivers SWD. A control signal generating circuit for controlling the sub word line driver SWD and a control signal generating circuit for controlling the sense amplifier are arranged on the conjunction region CJ. Local data I/O line pairs LIO11/~LIO11m, LIO12/~LIO12m, . . . , LIO(k−1)k1~LIO(k−1)km, LIOkk1~LIOkkm are separately arranged in a vertical direction above regions on which the sense amplifiers SA1 and SA2 and the conjunction regions CJ are arranged. Global data I/O line pairs GIO1 to GIO2m are arranged in a transverse direction of a plurality of sub memory cell array blocks SMCA. A first power voltage lines VCCA and a second power voltage lines VSSA are arranged in turn in a transverse direction.

Unlike the conventional semiconductor memory device, as described above, the semiconductor memory device of the present invention is configured so that the data I/O line pairs IO11~IO12 to IO(k−1)k,IOkk are divided into the local data I/O line pairs LIO111~LIO11$m$, LIO121~LIO12$m$, . . . , LIO(k−1)k1~LIO(k−1)km, LIOkk1~LIOkkm, respectively, and the global data I/O line pairs GIO1,GIO2 to GIO2m−1,GIO2$m$ are arranged in a perpendicular direction to the local data I/O line pairs LIO111~LIOkk1, LIO112~LIOkk2, . . . , LIO11$m$,LIOkkm, respectively.

The sense amplifiers SA1 and SA2 arranged on left and right sides of the sub memory cell array blocks SMCA of the present invention have configurations different from the sense amplifier SA of the conventional semiconductor memory device.

Also, the semiconductor memory device of FIG. 3 includes the local data line pairs and the global data line pairs and has a configuration that data are inputted or outputted through the global data line pairs arranged in a perpendicular direction to the local data line pairs.

Decoupling capacitors of the semiconductor memory device of the present invention are arranged not only on an empty space of the column decoder 22 and between the first and second power voltage lines VCCA and VSSA of the decoupling capacitor blocks 24-1 and 24-2, but also on an empty space of the sense amplifiers SA1 and SA2. The decoupling capacitor is comprised of MOS capacitors.

The decoupling capacitors of the present invention are arranged in the memory cell array, and thus a level variation of the first and second power voltage lines is reduced during a bit line sensing operation, leading to an excellent operational performance of the semiconductor memory device.

Figure 4:
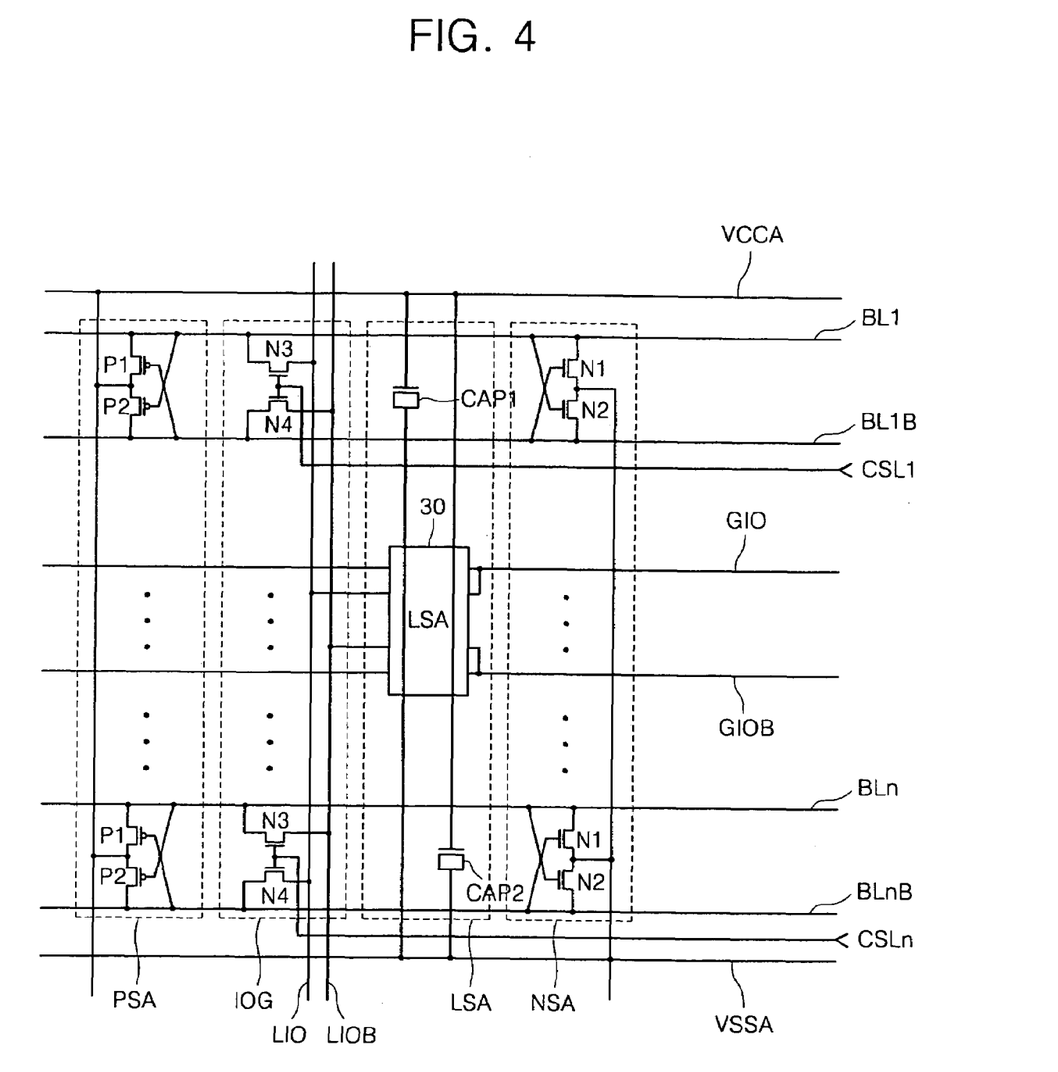
FIG. 4 is a schematic view illustrating a sense amplifier SA1 of the semiconductor memory device of FIG. 3.

FIG. 4 is a schematic view illustrating the sense amplifier SA1 of the semiconductor memory device of FIG. 3. The sense amplifier SA1 includes a PMOS sense amplifier PSA, a data I/O gate 10G, a local sense amplifier LSA, and an NMOS sense amplifier NSA.

The PMOS sense amplifier PSA, the data I/O gate 10G, and the NMOS sense amplifier NSA have the same configuration as those of the sense amplifier SA of FIG. 2, respectively. The local sense amplifier (LSA) assembly designated by the dotted line box includes a local sense amplifier 30 and decoupling capacitors CAP1 and CAP2 arranged on an empty region on which the local sense amplifier 30 is not arranged. The decoupling capacitors CAP1 and CAP2 are connected between the first and second power voltage lines VCCA and VSSA, respectively. The local sense amplifier 30 is arranged on a region between the data I/O gate IOG and the NMOS sense amplifier NSA and is also arranged between the local data I/O line pairs LIO,LIOB and the global data I/O line pair GIO,GIOB. One local sense amplifier 30 is provided for one local data I/O line pair LIO,LIOB within the LSA assembly. The decoupling capacitors CAP1 and CAP2 include MOS capacitors.

Operation of the sense amplifier of FIG. 4 is explained below.

The PMOS sense amplifier PSA, the NMOS sense amplifier NSA, and the data I/O gate IOG perform the same operation as those of the sense amplifier of FIG. 2. The local sense amplifier 30 amplifies data of the local data I/O line pair LIO,LIOB and transmits the data to the global data I/O line pair GIO,GIOB during a read operation.

That is, the sense amplifier SA1 of the semiconductor memory device of the present invention has the local sense amplifier 30 and the decoupling capacitors arranged on a region on which the PMOS and NMOS sense amplifiers are not arranged, and thus efficiently filters noise generated in the memory cell array, in particular, on a central portion of the memory cell array.

Figure 5:
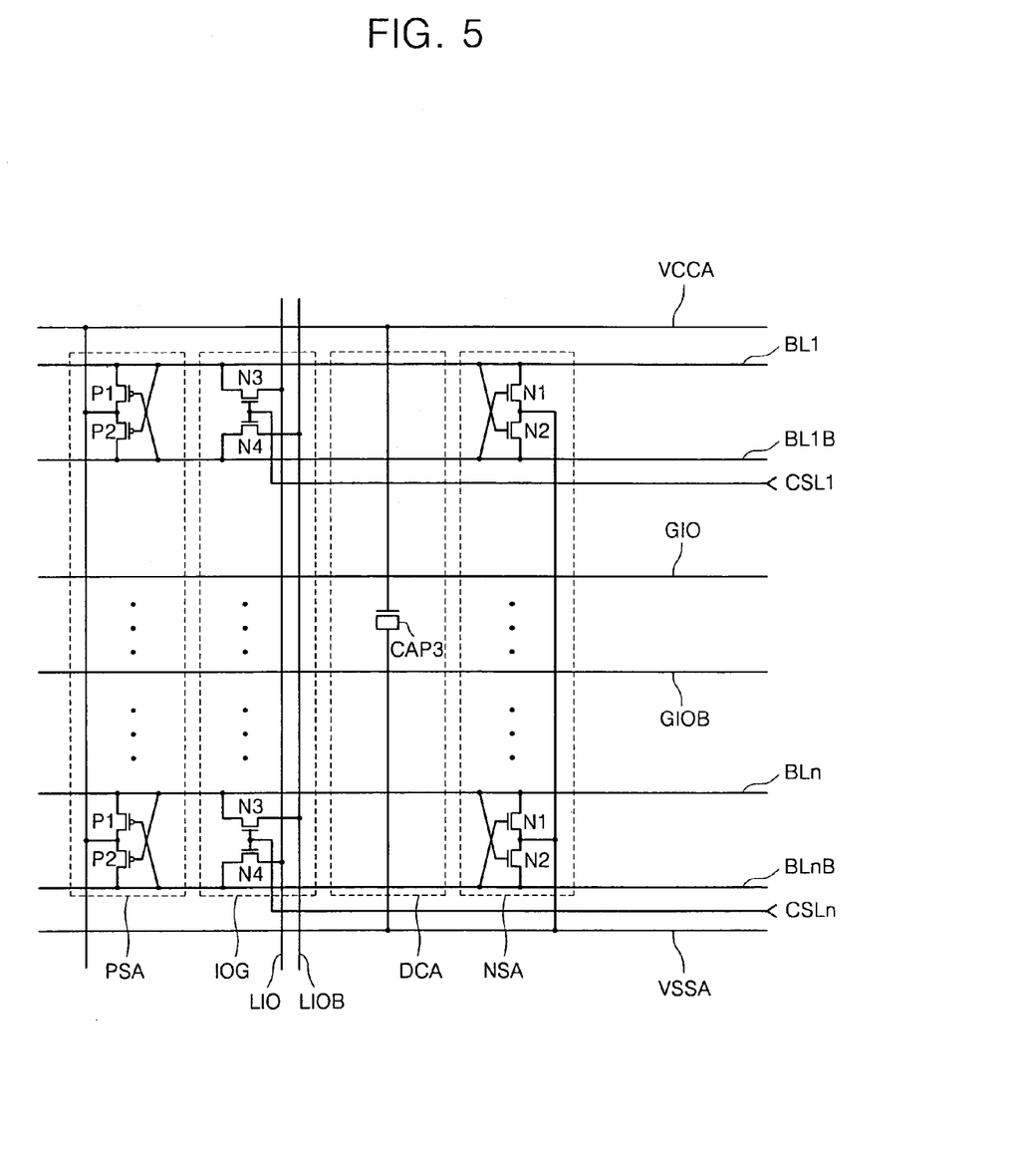
FIG. 5 is a schematic view illustrating a sense amplifier SA2 of the semiconductor memory device of FIG. 3.

FIG. 5 is a schematic view illustrating the sense amplifier SA2 of the semiconductor memory device of FIG. 3. The sense amplifier SA2 of FIG. 5 includes a PMOS sense amplifier PSA, a data I/O gate IOG, a decoupling capacitor DCA, and an NMOS sense amplifier NSA.

The PMOS sense amplifier PSA, the data I/O gate 10G, and the NMOS sense amplifier NSA have the same configuration as those of the sense amplifier of FIG. 2. The decoupling capacitor DCA includes a decoupling capacitor CAP3 connected between the first and second power voltage lines VCCA and VSSA. The decoupling capacitor CAP3 includes MOS capacitors.

The sense amplifier SA2 of FIG. 5 does not have the local sense amplifier 30 of the sense amplifier SA1 of FIG. 4, and thus the decoupling capacitor CAP3 is arranged on the whole region on which the local sense amplifier LSA of FIG. 4 is arranged.

Operation of the sense amplifier of FIG. 5 is explained below.

The PMOS sense amplifier PSA, the NMOS sense amplifier NSA, and the data I/O gate IOG perform the same operation as those of the sense amplifier of FIG. 2. The decoupling capacitor DCA filters noise of the first and second power voltage lines VCCA and VSSA.

That is, the semiconductor memory device is configured so the sense amplifier having the local sense amplifier and the sense amplifier having no local sense amplifier are alternately arranged. Thus the decoupling capacitor is arranged on an empty region on which the local sense amplifier is not arranged. Therefore, it is possible to arrange the decoupling capacitor in the memory cell array so that the time that is spent to recover the level of the power voltage when noise occurs is reduced.

In the embodiment of the present invention it is exemplarily explained that the decoupling capacitor is comprised of MOS capacitors. However, the decoupling capacitor can be comprised of memory cell capacitors. When the decoupling capacitor is comprised of the memory cell capacitors, a relatively large capacitance is obtained in the same area, and thus the decoupling capacitor has a large capacitance, leading to a high noise filtering effect.

Also, in the embodiment of the present invention, it is exemplarily explained that the local sense amplifier is arranged between the data I/O gate and the NMOS sense amplifier. However, the local sense amplifier can be arranged between the PMOS sense amplifier and the data I/O gate. That is, it does not matter if the local sense amplifier is arranged on a specific location in the sense amplifier.

As described hereinbefore, according to the present invention, the decoupling capacitor can be arranged between the first and second power voltage lines in the memory cell array, whereby operational characteristics of the semiconductor memory device is improved.

What is claimed is:

1. A method of arranging a decoupling capacitor of a semiconductor memory device, the semiconductor memory device including a plurality of sub memory cell array blocks including a plurality of memory cells connected between a plurality of word lines and a plurality of bit line pairs, a plurality of local data I/O line pairs separately arranged between each of the plurality of the sub memory cell array blocks, and a plurality of global data I/O line pairs arranged in a perpendicular direction to the plurality of the local data I/O line pairs, the method comprising:
arranging first sense amplifiers on left and right sides of each of first sub memory cell array blocks among the plurality of the sub memory cell array blocks;
arranging second sense amplifiers, each having a different layout and construction from that of the first sense amplifiers, on left and right sides of each of second sub memory cell array blocks among the plurality of the sub memory cell array blocks with only the second of the first and second sub memory cell array blocks between the second sense amplifiers; and
arranging the decoupling capacitor on an empty region of the plurality of the first and second sense amplifiers and connecting the decoupling capacitor between first and second power voltage lines; wherein of the first and second sense amplifiers, only the first sense amplifiers include local sense amplifiers.

2. The method of claim 1, wherein the arranging the plurality of first sense amplifiers further comprises:
arranging PMOS and NMOS sense amplifiers between the plurality of the bit line pairs, respectively; and
arranging a local sense amplifier between regions on which a plurality of the PMOS and NMOS sense amplifiers is not arranged, and arranging the decoupling capacitor on an empty region on which the local sense amplifier is not arranged.

3. The method of claim 1, wherein the arranging the plurality of second sense amplifiers further comprises:
arranging PMOS and NMOS sense amplifiers between the plurality of the bit line pairs, respectively; and
arranging a decoupling capacitor between regions on which the plurality of the PMOS and NMOS sense amplifiers is not arranged.

4. The method of claim 1, further comprising arranging each of the first sub memory cell array blocks alternately with each of the second sub memory cell array blocks.

5. The method of claim 1, wherein only the first of the first and second sub memory cell array blocks is between the first sense amplifiers.

6. The method of claim 1, wherein the first and the second sense amplifiers are associated with one of the global data I/O line pairs.

7. The method of claim 1, wherein the first and the second sense amplifiers are associated with one of the local data I/O line pairs.

8. The method of claim 2, wherein the local sense amplifier of the first sense amplifier receives data output from the second sense amplifier.

9. A method of arranging a decoupling capacitor of a semiconductor memory device, the method comprising:
arranging a plurality of first sense amplifiers on left and right sides of each of first sub memory cell array blocks among a plurality of sub memory cell array blocks;
arranging a plurality of second sense amplifiers, each having a different layout and construction from that of the first sense amplifiers, on left and right sides of each of second sub memory cell array blocks among the plurality of sub memory cell array blocks with only the second of the first and second sub memory cell array blocks between the second sense amplifiers; and
arranging the decoupling capacitor on an empty region of the plurality of first and second sense amplifiers and connecting the decoupling capacitor between a first and a second power voltage line; wherein of the first and second sense amplifiers, only the first sense amplifiers include local sense amplifiers.

10. A semiconductor memory device, comprising:
a first group comprising
first and second sub memory cell array blocks each including a plurality of memory cells connected between a plurality of word lines and a plurality of bit lines;
a first local data I/O line pair;
a first global data I/O line pair arranged in a perpendicular direction to the first local data I/O line pair;
a pair of first sense amplifiers arranged on opposing sides of the first sub memory cell array block;
a pair of second sense amplifiers, electronically configured differently and having different construction than the first sense amplifiers, arranged on opposing sides of the second sub memory cell array block, wherein only the second of the first and second sub memory cell array blocks is between the second sense amplifiers,
a second group comprising
the first and second sub memory cell array blocks;
a second local data I/O line pair operatively connected to the first and second sub memory cell array blocks;
a second global data I/O line pair arranged in a perpendicular direction to the second local data I/O line pair;
a second pair of the first sense amplifiers arranged on opposing sides of the first sub memory cell array block; and
a second pair of the second sense amplifiers arranged on opposing sides of the second sub memory cell array block,
wherein the first and the second local data I/O line pairs are electronically separate from each other, and
wherein a decoupling capacitor is arranged on an empty region of the plurality of the first and second sense amplifiers and connected between first and second power voltage lines; wherein of the first and second sense amplifiers, only the first sence amplifers include local sense amplifiers.

11. A semiconductor memory device comprising:
a plurality of groups of first and second sub memory cell array blocks including a plurality of memory cells connected between a plurality of word lines and a plurality of bit lines, the first and second sub memory cell array blocks alternately arranged;
a plurality of local data I/O line pairs each separately connected to a different group of the first and second sub memory cell array blocks;
a plurality of global data I/O line pairs arranged perpendicular to the plurality of local data I/O line pairs;
a plurality of first sense amplifiers arranged on opposing sides of each of the groups of the first sub memory cell array blocks; and
a plurality of second sense amplifiers arranged on opposing sides of each of the groups of the second sub memory cell array blocks, the first sense amplifier and the second sense amplifier having different layouts and constructions, wherein only the second of the first and second sub memory cell array blocks is between the second sense amplifiers,
wherein a decoupling capacitor is arranged on an empty region of the plurality of first and second sense amplifiers and connected between first and second power voltage lines.

12. The device of claim 11, wherein the decoupling capacitor includes a MOS capacitor.

13. The device of claim 11, wherein the decoupling capacitor is identical to a capacitor comprised in one of the plurality of the memory cells.

14. The device of claim 11, wherein each of the plurality of first sense amplifiers comprises:
- a PMOS sense amplifier to amplify data of a bit line pair;
- an NMOS sense amplifier to amplify data of the bit line pair;
- a local sense amplifier arranged between the PMOS sense amplifier and the NMOS sense amplifier and to amplify data of one of the plurality of local data I/O line pairs to be transmitted to one of the plurality of global data I/O line pairs, the number of local sense amplifiers being equal to the number of local data I/O line pairs; and
- the decoupling capacitor arranged between the PMOS sense amplifier and the NMOS sense amplifier and arranged on an empty region on which the local sense amplifier is not arranged.

15. The device of claim 11, wherein each of the plurality of second sense amplifiers comprises:
- a PMOS sense amplifier to amplify data of a bit line pair;
- an NMOS sense amplifier to amplify data of the bit line pair; and
- the decoupling capacitor arranged between the PMOS sense amplifier and the NMOS sense amplifier.

16. A semiconductor memory device, comprising:
- a plurality of first sense amplifiers;
- a plurality of first sub memory cell array blocks, each first sub memory cell array block disposed between a corresponding two of the first sense amplifiers;
- a plurality of second sense amplifiers;
- a plurality of second sub memory cell array blocks, each second sub memory cell array block disposed between a corresponding two of the second sense amplifiers;
- each first sense amplifier including:
  - a plurality of bit line sense amplifiers coupled to a plurality of bit lines of the corresponding first sub memory cell array block;
  - a plurality of data input/output gates, each data input/output gate coupled between a corresponding pair of the bit lines and a local data input/output line pair corresponding to the first sense amplifier;
  - a local sense amplifier coupled between the local data input/output line pair and a global data input/output line pair; and
  - a decoupling capacitor coupled between first and second power voltage lines for the first sense amplifier; and
- each second sense amplifier including:
  - a plurality of bit line sense amplifiers coupled to a plurality of bit lines of the corresponding second sub memory cell array block;
  - a plurality of data input/output gates, each data input/output gate coupled between a corresponding pair of the bit lines and a local data input/output line pair corresponding to the second sense amplifier; and
  - a decoupling capacitor coupled between first and second power voltage lines for the second sense amplifier;
- wherein of the first and second sense amplifiers, only the first sense amplifiers include local sense amplifiers.

17. The semiconductor memory device of claim 16, wherein for each first sense amplifier and each second sense amplifier:
- each bit line sense amplifier includes a PMOS sense amplifier and an NMOS sense amplifier; and
- the decoupling capacitor is disposed between the PMOS sense amplifiers and the NMOS sense amplifiers.

18. The semiconductor memory device of claim 17, wherein for each first sense amplifier:
- the local sense amplifier is disposed between the PMOS sense amplifiers and the NMOS sense amplifiers.

* * * * *

UNITED STATES PATENT AND TRADEMARK OFFICE
CERTIFICATE OF CORRECTION

| | | |
|---|---|---|
| PATENT NO. | : 7,352,646 B2 | Page 1 of 1 |
| APPLICATION NO. | : 11/024348 | |
| DATED | : April 1, 2008 | |
| INVENTOR(S) | : Hyung-Chan Choi et al. | |

It is certified that error appears in the above-identified patent and that said Letters Patent is hereby corrected as shown below:

Column 1, line 53, the word "10" should read -- IO --;
Column 4, line 58, the word "LIO11/" should read -- LIO111 --;
Column 4, line 59, the word "LIO12/" should read -- LIO121 --;
Column 5, line 4, the word "IO11-IO12" should read -- IO11,IO12 --;
Column 5, line 37, the word "10G," should read -- IOG, --;
Column 5, line 39, the word "10G," should read -- IOG, --;
Column 6, line 9, the word "10G," should read -- IOG, --;
Column 8, line 39, the words "sence amplifers" should read -- sense amplifiers --;
Column 8, line 65, the word "lines." should read -- lines; wherein of the first and second sense amplifiers, only the first sense amplifiers include local sense amplifiers. --.

Signed and Sealed this

Twenty-eighth Day of October, 2008

JON W. DUDAS
*Director of the United States Patent and Trademark Office*